(12) United States Patent
Hsu

(10) Patent No.: US 6,169,011 B1
(45) Date of Patent: Jan. 2, 2001

(54) TRENCH ISOLATION STRUCTURE AND METHOD FOR SAME

(75) Inventor: Sheng Teng Hsu, Camas, WA (US)

(73) Assignees: Sharp Laboratories of America, Inc., Camas, WA (US); Sharp Kabushiki Kaisha, Osaka (JP)

( * ) Notice: Under 35 U.S.C. 154(b), the term of this patent shall be extended for 0 days.

(21) Appl. No.: 09/047,038

(22) Filed: Mar. 24, 1998

(51) Int. Cl.[7] .................................................. H01L 21/76
(52) U.S. Cl. ........................... 438/424; 438/425; 438/439
(58) Field of Search .................................. 438/444, 143, 438/439, 425, 424

(56) References Cited

U.S. PATENT DOCUMENTS

| | | | |
|---|---|---|---|
| 5,206,182 | 4/1993 | Freeman | 148/203 |
| 5,387,540 | 2/1995 | Poon et al. | 438/430 |
| 5,436,488 | 7/1995 | Poon et al. | 257/397 |
| 5,874,325 | * 2/1999 | Koike | 438/143 |
| 5,972,778 | * 10/1999 | Hamada | 438/444 |
| 6,002,160 | * 12/1999 | He et al. | 257/513 |

OTHER PUBLICATIONS

K. Shibahara et al., "Trench Isolation with (Nabla)–shaped Buried oxide for 256 MEGA–BIT DRAMS" pp 10.5.1–10.5.4, IDEM 92–275 Dec. 1992.

* cited by examiner

Primary Examiner—Olik Chaudhuri
Assistant Examiner—William David Coleman
(74) Attorney, Agent, or Firm—David C. Ripma; Matthew D. Rabdau

(57) ABSTRACT

A method of forming an improved trench isolation structure between transistors on an IC is disclosed. The isolation trench is formed without significantly degrading, or thinning the previously deposited gate oxide layer. The gate oxide layer is deposited on the silicon substrate and covered with a first polysilicon layer. A trench is etched through the first polysilicon layer and gate oxide layer, into the silicon substrate. The edges of the silicon substrate and polysilicon layer, exposed by the trench, are oxidized. The trench is filled with oxide and a CMP is performed. After the CMP, a second layer of polysilicon is deposited. The transistor is then etched to form a gate electrode including both layers of polysilicon. The formation of oxide on the trench sidewalls prevents the degradation of the gate oxide layer in the subsequent CMP and IC fabrication processes. The transistor has a high breakdown voltage and low leakage current. An improved trench isolation structure and process for forming a trench isolation structure are also provided.

3 Claims, 4 Drawing Sheets

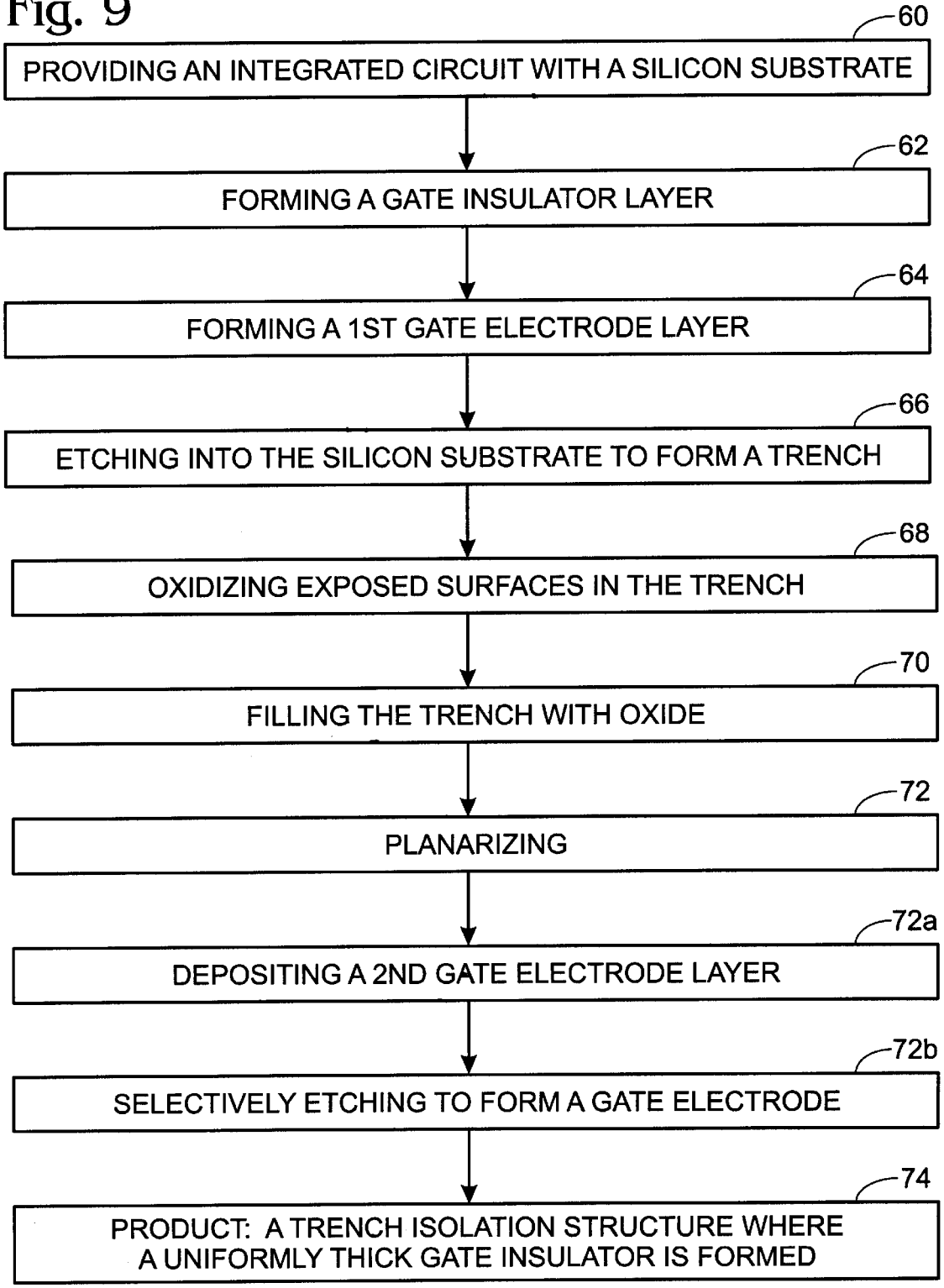

TRENCH ISOLATION STRUCTURE AND METHOD FOR SAME

BACKGROUND AND SUMMARY OF THE INVENTION

This invention relates generally to integrated circuit (IC) fabrication processes, and more specifically to a trench isolation structure and method of forming an isolation trench which maintains a minimally thick gate oxide layer.

To prevent the flow of leakage currents between transistors in an IC, adjoining transistors must be isolated. As the size of the transistors decreases and the density of transistors in an IC increases, the isolation structures between transistors becomes more important. Growing oxide as an isolation structure through the localized oxidation of silicon (LOCOS) often results in the formation of a large "bird's beak". A bird's beak is a tapered wedge of oxide over a silicon substrate active areas. The bird's beak interferes with subsequently formed gate oxide layers. Ultimately, the drain current of narrow channel width transistors is impacted.

A trench isolation method was developed in response to the bird's beak problem associated with the LOCOS isolation method. Typically, a gate oxide layer is formed over a silicon substrate, with a SiN layer overlying the gate oxide layer. A trench is etched through the SiN layer, the gate oxide layer, and into the silicon substrate. The trench is then filled with oxide. Unfortunately, the planarization of the surface, of excess oxide often leaves the top surface of the oxide-filled trench either slightly above, or slightly below the gate oxide layer. Typically, the gate oxide at the point of intersection is thin. These areas of thin gate oxide cause the subsequently formed transistor to have a low breakdown voltage and high leakage current.

It would be advantageous if transistors isolated by a trench isolation structure had a high breakdown voltage.

It would be advantageous if a minimum gate oxide layer thickness could be maintained when trench isolation is used to isolated adjacent transistors.

It would be advantageous if the minimum gate oxide thickness could be maintained in a relatively simple refinement to the standard trench isolation procedure.

Accordingly, in an integrated circuit, a method for isolating transistors on a silicon substrate with a trench structure has been provided. The method comprising the steps of:

a) forming a layer of gate insulator material selected from the group consisting of silicon oxide, $TiO_2$, and $Ta_3O_5$, and having a first uniform thickness in the range between 2 and 10 nanometers (nm) overlying the silicon substrate;

b) forming a first layer of gate electrode material selected from the group consisting of polysilicon, W, and Mo, having a surface and a second thickness in the range between 20 and 100 nm, overlying the gate insulator layer;

c) etching a predetermined area of the silicon substrate, forming a silicon substrate trench with a third thickness in the range between 300 and 700 nm, through the overlying gate insulator and first gate electrode layers, forming a trench with first gate electrode sidewalls, which overlie gate insulator sidewalls, which overlie silicon substrate sidewalls;

d) oxidizing exposed surfaces to a fourth thickness in the range between 5 and 50 nm, including the silicon substrate and first gate electrode sidewalls of the trench;

e) filling the trench with oxide; and f) planarizing to remove oxide and a portion of the first gate electrode material from the surface of the first gate electrode layer, forming a first gate electrode layer fifth thickness in the range between 20 and 100 nm. A minimally thick gate insulator is formed to prevent low breakdown voltages.

The method further comprising the steps, following Step f), of:

g) depositing a second layer of gate electrode material, of the same material as the first gate electrode layer, selected from the group consisting of polysilicon, W, and Mo, and having a sixth thickness in the range between 100 and 300 nm overlying the surface of the first gate electrode layer and the oxide-filled trench; and h) selectively etching a predetermined area of the second gate electrode layer, and underlying first gate electrode layer to form a gate electrode overlying predetermined areas of the gate insulator layer and trench. A transistor gate electrode is formed with a large gate breakdown voltage and low leakage currents due to the gate insulator having a uniform thickness of at least 2 nm. By uniform thickness it is meant that the gate insulator thickness along the edge of the source and drain regions, adjoining the oxide trench, are at least as thick as any other region of gate insulator thickness, such as the region underlying the gate electrode. In some aspects of the invention, the gate insulator first thickness adjoining the isolation trench is even slightly larger than the thickness of insulator underlying the gate electrode.

An integrated trench structure and a process to form a trench structure to isolate transistors on a silicon substrate are also provided. The trench structure comprises a layer of gate insulator material having a first uniform thickness overlying the silicon substrate, and a layer of first gate electrode material having a surface and a fifth thickness overlying the gate oxide layer.

A trench is formed by etching from a predetermined area of said first gate electrode layer surface, through said gate insulator layer, and into the silicon substrate forming a silicon substrate trench having a third thickness, and forming first gate electrode layer trench sidewalls, overlying gate insulator layer trench sidewalls, overlying silicon substrate trench sidewalls.

Oxidized trench sidewalls having a fourth thickness are formed by oxidizing the first gate electrode layer sidewalls and the silicon substrate trench sidewalls. The oxidized sidewalls separate the first gate electrode material and the silicon substrate from the trench.

A trench oxide structure formed by filling the trench with oxide, planarizing a second thickness of the first gate electrode layer down to the fifth thickness, while planarizing the oxide-filled trench to the surface level of the first gate electrode layer fifth thickness. A uniformly thick oxide layer insulates the overlying first gate electrode layer from the silicon substrate.

The trench structure further comprises a completed gate electrode formed by depositing a layer of second gate electrode material having a sixth thickness overlying the surface of the first gate electrode layer and the oxide-filled trench. A predetermined area of the second gate electrode layer, and underlying first gate electrode layer are selectively etched to form the completed gate electrode overlying predetermined areas of the gate insulator layer and trench. The completed transistor gate electrode is formed with a large breakdown voltage and low leakage currents due to the uniform thickness of the gate insulator.

BRIEF DESCRIPTION OF THE DRAWINGS

FIG. 9 is a flow chart illustrating a method for isolating transistors with a trench structure.

DETAILED DESCRIPTION OF THE PREFERRED EMBODIMENT

Figure 1:
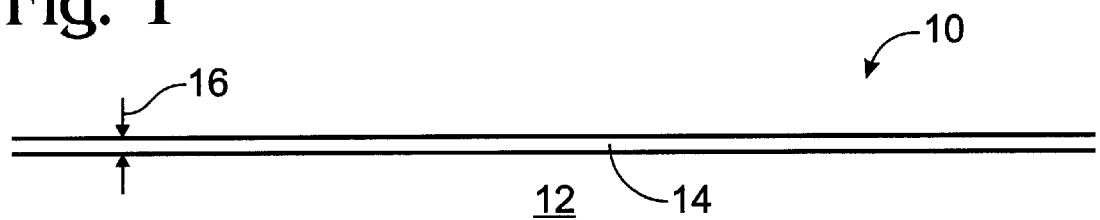
FIGS. 1–8 illustrates in the process of forming the integrated trench structure of the present invention to isolate transistors.

FIGS. 1–8 illustrate steps in the process of forming the integrated trench structure of the present invention to isolate transistors. FIG. 1 depicts an IC 10 including a silicon substrate 12. A layer of gate insulator material 14 having a first uniform thickness 16 overlies silicon substrate 12. Gate insulator layer first uniform thickness 16 is in the range between 2 and 10 nanometers (nm). The advantage of the present invention is that gate insulator thickness 14 is maintained to a uniform thickness through the subsequent steps of forming an oxide isolation trench. By uniform thickness it is meant that thickness 16 of gate insulator 14 is at least as thick in the regions adjoining subsequently formed oxide isolation trenches, as it is in any other region of the transistor, such as the region underlying the subsequently formed gate electrode. Gate insulator material 14 is selected from the group consisting of silicon oxide, $TiO_2$, and $Ta_3O_5$.

Figure 2:
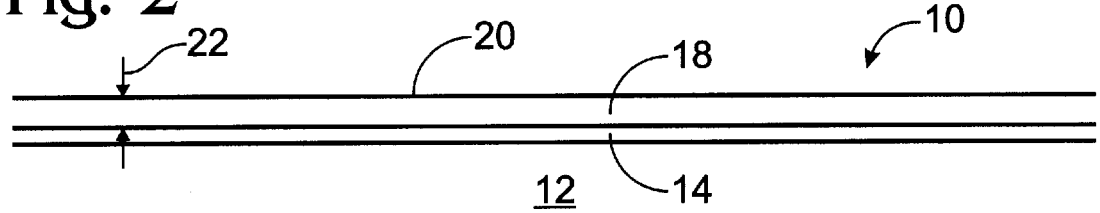

FIG. 2 depicts a layer of first gate electrode material 18 having a surface 20 and a second thickness 22 overlying gate insulator layer 14. First gate electrode layer second thickness 22 is in the range between 20 and 100 nanometers nm. As described below, after planarization second thickness 22 becomes a fifth thickness.

Figure 3:
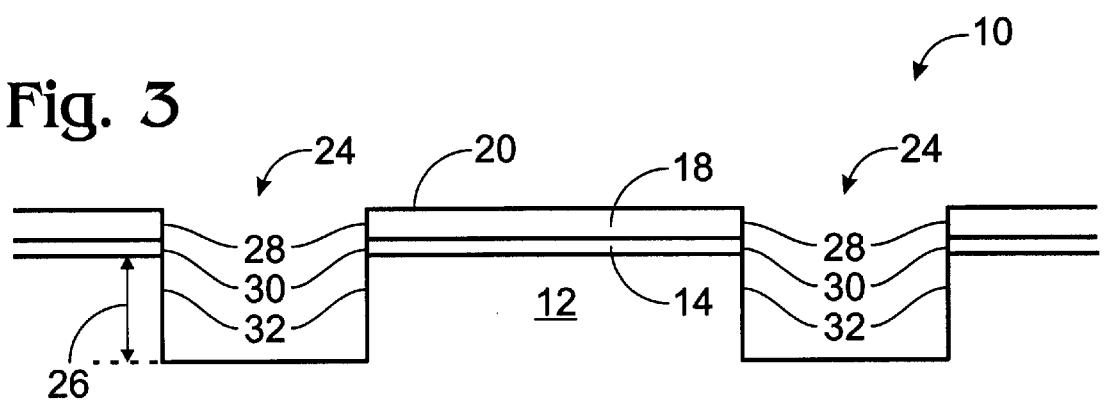

FIG. 3 depicts a trench 24 formed by etching from a predetermined area of first gate electrode layer surface 20, through gate insulator layer 14, and into silicon substrate 12 forming a silicon substrate trench having a third thickness 26. Silicon substrate trench third thickness 26 is in the range between 300 and 700 nm. First gate electrode layer sidewalls 28, overlie gate insulator layer sidewalls 30, which overlie silicon substrate sidewalls 32.

Figure 4:
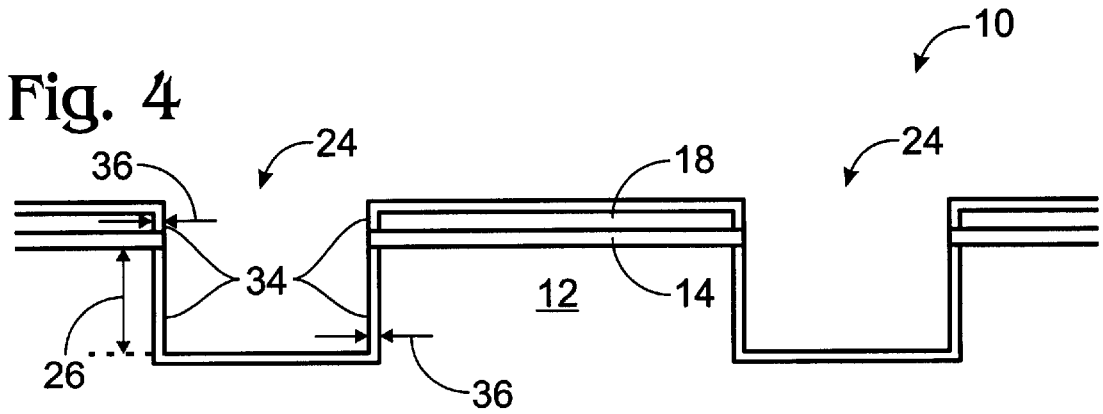

FIG. 4 depicts oxidized trench sidewalls 34 having a fourth thickness 36 formed by oxidizing first gate electrode layer sidewalls 28 and silicon substrate trench sidewalls 32. Oxide fourth thickness 36 is in the range between 5 and 50 nm. Typically, gate insulator layer sidewalls 30 are already oxide. When gate insulator layer sidewalls 30 are not oxide, they are an insulator having properties similar to oxide. Oxidized sidewalls 34 separate first gate electrode material 18 and silicon substrate 12 from trench 24, subsequently filled with oxide.

Figure 5:
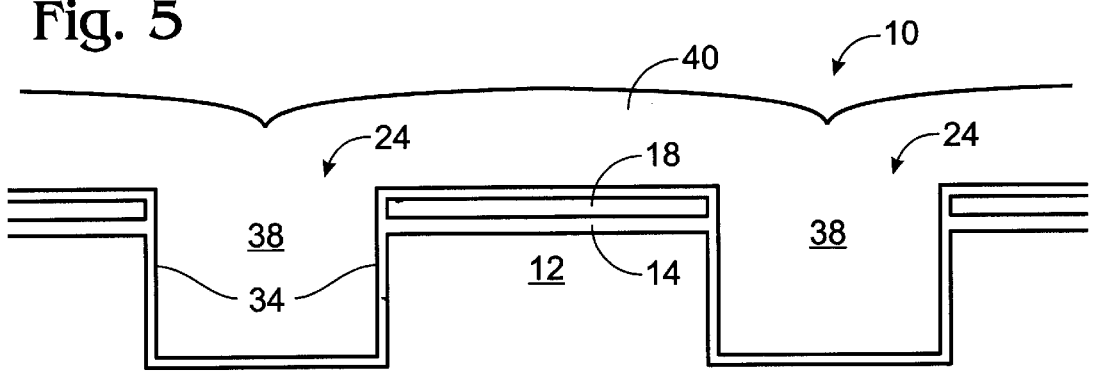

FIG. 5 depicts a trench oxide structure 38, or oxide-filled trench formed by filling said trench 24 with oxide 40. Oxide-filled trench 38 extends from a predetermined area of first gate electrode layer surface 20, through gate insulator layer 18, and into silicon substrate trench 24 having third thickness 26.

Figure 6:
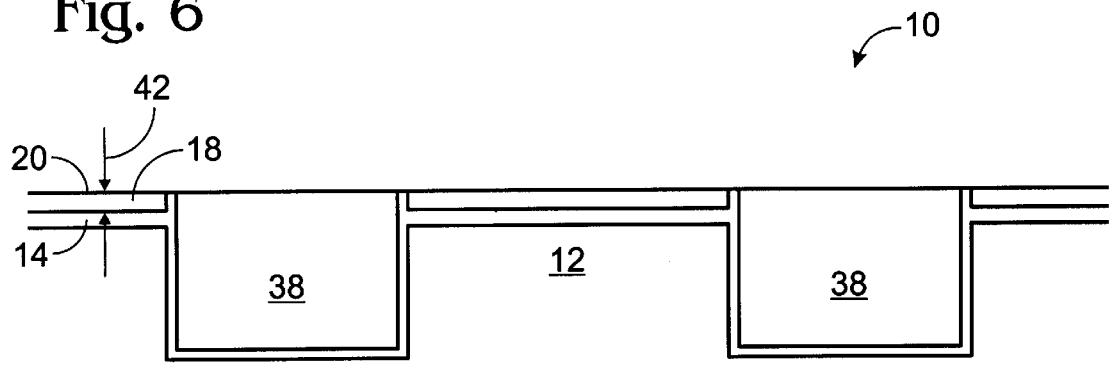

FIG. 6 depicts first gate electrode layer 18 being planarized through a process such as a chemical mechanical polish (CMP). Second thickness 22 of first gate electrode layer 18 is planarized down to a fifth thickness 42. Simultaneously, oxide-filled trench 38 is planarized to the surface level 20 of first gate electrode layer fifth thickness 42. First gate electrode layer fifth thickness 42 is in the range between 20 and 100 nm. A uniformly thick oxide layer 14 still insulates overlying first gate electrode layer 18 from silicon substrate 12.

Figure 7:
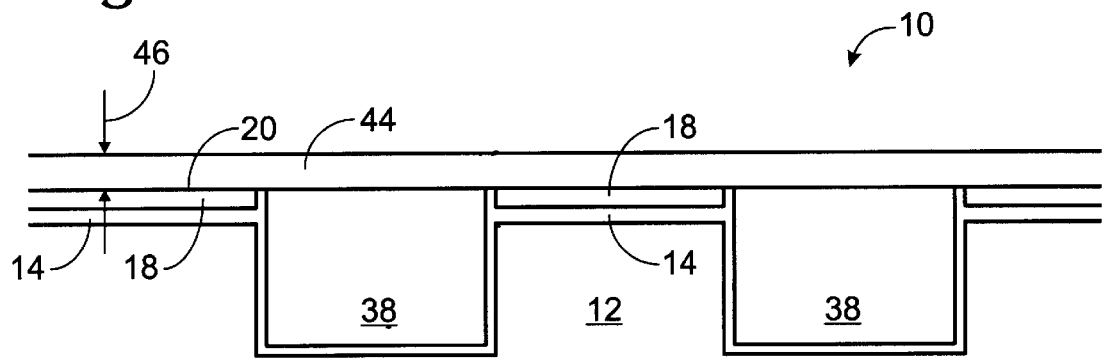

FIG. 7 depicts a further step towards forming a completed lo gate electrode. A layer of second gate electrode material 44, of the same material as first gate electrode 18, has been deposited. Second gate electrode layer 44 has a sixth thickness 46 overlying surface 20 of first gate electrode layer 18 and oxide-filled trench 38. Second gate electrode layer sixth thickness 46 is in the range between 100 and 300 nm. First 18 is and second 44 gate electrode materials are selected from the group consisting of polysilicon, W, and Mo. First 18 and second 44 gate electrode layers are in place for subsequent processing into a complete gate electrode.

Figure 8:
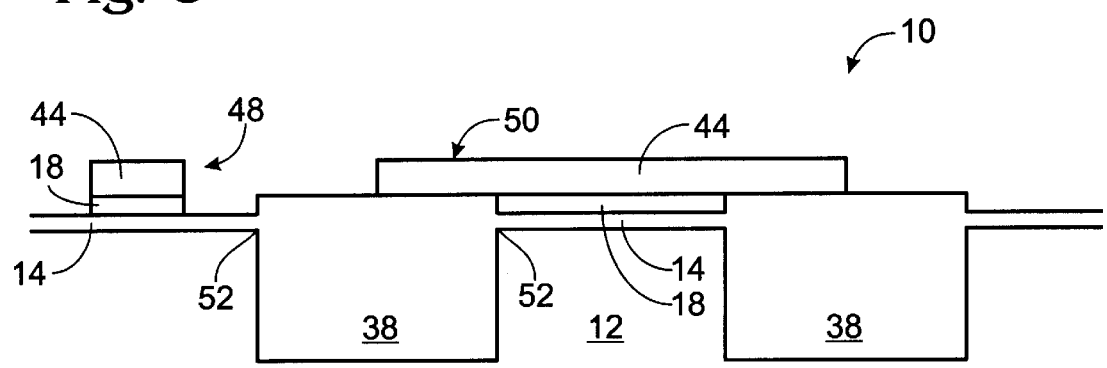

FIG. 8 depicts the completed gate electrodes 48 and 50. Gate electrode 50 is the same as gate electrode 48, but rotated 90 degrees to show gate electrode 48 from a different perspective. A predetermined area of second gate electrode layer 44 and underlying first gate electrode layer 18 have been selectively etched to form completed gate electrodes 48 and 50 overlying predetermined areas of gate insulator layer 14 and trench 38. Completed transistor gate electrodes 48 and 50 are formed with a large breakdown voltage and low leakage currents due to the uniform thickness of gate insulator layer 14. That is, in the areas where gate insulator 14 intersect oxide-filled trench 38, gate insulator layer 14 has not been degraded or thinned. A transistor formed with uniform thickness 16 has high breakdown voltage. Many transistors isolated with prior art trench structures have thin gate insulation thickness adjoining the trench. These areas of thin insulation lead to low breakdown voltages. By uniform thickness it is meant that thickness 16 of gate insulator 14 is at least as thick in the regions adjoining oxide isolation trench 38, such as gate isolation region 52, as gate insulation thickness 16 in the region underlying gate electrode 48. In some aspects of the invention, gate insulation region 52 has thickness 16 even slightly greater than gate insulation thickness 16 underlying gate electrode 48.

FIG. 9 is a flow chart illustrating a method for isolating transistors with a trench structure. Step 60 provides an integrated circuit with a silicon substrate. Step 62 forms a layer of gate insulator material having a first uniform thickness overlying the silicon. Step 62 includes the gate oxide layer first uniform thickness being in the range between 2 and 10 nanometers (nm). Step 62 also includes the gate insulator material being selected from the group consisting of silicon oxide, $TiO_2$, and $Ta_3O_5$. Step 64 forms a first layer of gate electrode material having a surface and a second thickness overlying the gate insulator layer. Step 64 includes the first gate electrode layer second thickness being in the range between 20 and 100 nm. Steps 64 also includes the first gate electrode material being selected from the group consisting of polysilicon, W, and Mo. Step 66 etches a predetermined area of the silicon substrate, forming a silicon substrate trench having a third thickness, through the overlying gate insulator and first gate electrode layers, and forming a trench with first gate electrode sidewalls, which overlie gate insulator sidewalls, which overlie silicon substrate sidewalls. Step 66 includes the silicon substrate trench third thickness being in the range between 300 and 700 nm.

Step 68 oxidizes exposed surfaces to a fourth thickness, including the silicon substrate sidewalls and first gate electrode sidewalls of the trench. Step 68 includes the oxide fourth thickness being in the range between 5 and 50 nm. Step 70 fills the trench with oxide. Step 72 planarizes to remove oxide and a portion of the first gate electrode material from the surface of the first gate electrode layer, forming a first gate electrode layer fifth thickness. Step 72 includes the first gate electrode layer fifth thickness being in the range between 20 and 100 nm. Step 74 is a product, a transistor having a trench isolation structure and a uniformly thick gate insulator layer.

Further steps follow Step 72 and precede Step 74. Step 72a deposits a second layer of gate electrode material, of the same material as the first gate electrode layer, having a sixth thickness, and overlying the surface of the first gate electrode layer and the oxide-filled trench. Step 72a includes the second gate electrode material being selected from the group consisting of polysilicon, W, and Mo. Step 72a also includes the second gate electrode layer sixth thickness being in the range between 100 and 300 nm. Step 72b selectively etches a predetermined area of the second gate electrode layer, and underlying first gate electrode layer to form a gate electrode overlying predetermined areas of the gate insulator layer and trench. In this manner, the product of Step 74 includes a transistor gate electrode formed with a large breakdown voltage and low leakage currents.

An improved trench isolation structure and method of forming the trench isolation structure has been provided. The process is cost effective, differing from a standard trench structure in the addition of two separate polysilicon layers to form the gate electrode, and in the oxidation of the trench sidewalls before the deposition of the trench oxide filling. This method of forming an isolation trench insures that the gate oxide is not degraded, or thinned in the area adjoining the oxide-filled trench. As a result, the subsequently formed transistor exhibits a high breakdown voltage. Other variations and embodiments of the above-described invention will occur to those skilled in the arts.

What is claimed is:

1. In an integrated circuit, a method for isolating transistors on a silicon substrate with a trench structure, the method comprising the steps of:

a) forming a layer of gate insulator material having a first uniform thickness overlying the silicon substrate;

b) forming a first layer of gate electrode material having a surface and a second thickness overlying the date insulator layer;

c) etching a predetermined area of the silicon substrate, to form a trench having a third thickness, through the overlying gate insulator and first gate electrode layers, and forming a trench with first gate electrode sidewalls, which overlie gate insulator sidewalls, which overlie silicon substrate sidewalls;

d) oxidizing exposed surfaces to a fourth thickness, including the silicon substrate sidewalls and first gate electrode sidewalls of the trench;

e) filling the trench with oxide;

f) planarizing to remove oxide and a portion of the first gate electrode material from the surface of the first gate electrode layer, forming a first gate electrode layer fifth thickness, whereby a uniformly thick gate insulator is formed;

g) depositing a second layer of gate electrode material, of the same material as the first gate electrode layer, having a sixth thickness overlying the surface of the first gate electrode layer and the oxide-filled trench; and h) selectively etching a predetermined area of the second gate electrode layer, and underlying first gate electrode layer to form a gate electrode overlying predetermined areas of the gate insulator layer and trench, whereby a transistor gate electrode is formed with a large breakdown voltage and low leakage currents.

2. A method as in claim 1 in which Step g) includes the second gate electrode layer sixth thickness being in the range between 100 and 300 nm.

3. A method as in claim 1 in which Steps b) and g) include, respectively, first and second gate electrode material being selected from the group consisting of polysilicon, W, and Mo.

* * * * *